RAMP GENERATOR AND COMPARATOR CIRCUIT EMPLOYING NON-SATURATING GATE
Filed Jan. 19, 1965
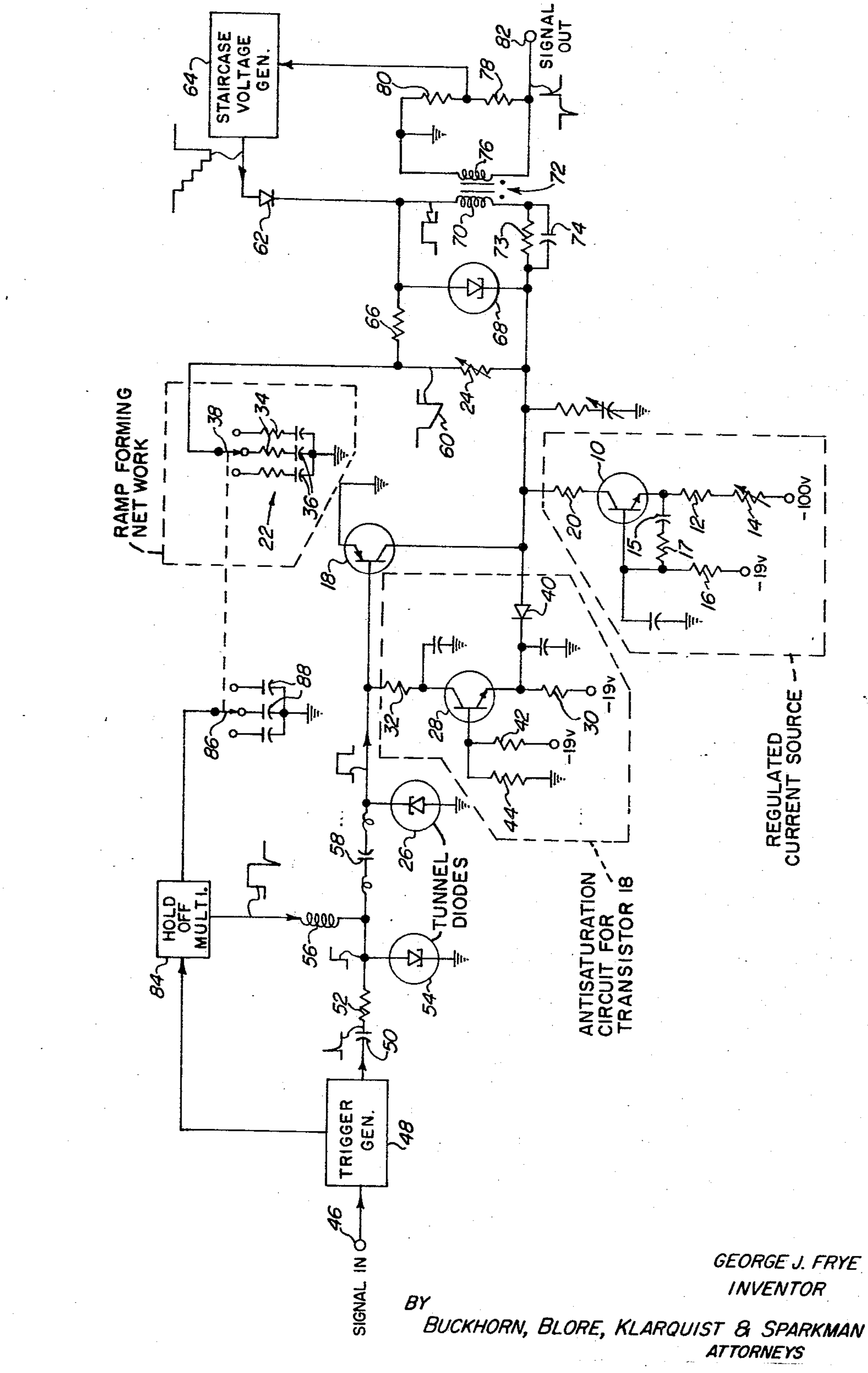
GEORGE J. FRYE
INVENTOR
BY
BUCKHORN, BLORE, KLARQUIST & SPARKMAN
ATTORNEYS United States Patent Office 3,344,285
Patented Sept. 26, 1967

3,344,285
RAMP GENERATOR AND COMPARATOR CIRCUIT EMPLOYING NON-SATURATING GATE

George J. Frye, Portland, Oreg., assignor to Tektronix, Inc., Beaverton, Oreg., a corporation of Oregon Filed Jan. 19, 1965, Ser. No. 426,584
12 Claims. (Cl. 307—88.5)

The subject matter of the present invention relates generally to electrical pulse generator circuits and in particular to a fast ramp generator and comparator circuit which produces an output pulse that is delayed a predetermined time with respect to an input trigger pulse.

The fast ramp generator and comparator circuit of the present invention is especially useful when employed as the timing unit of a sampling type cathode ray oscilloscope. Such timing unit produces an output pulse after a variable time delay when an input trigger pulse is applied to such timing unit in response to the receipt of a repetitive vertical input signal by the oscilloscope. The output pulse of the timing unit is transmitted to an interrogating pulse generator and causes it to render a sampling gate momentarily conducting to transmit a portion of the vertical input signal through such gate. The present ramp generator and comparator circuit varies the time delay of the output pulses by comparing a ramp voltage with a staircase voltage which changes one step for each output pulse so that different portions of the vertical input signal wave form are sampled for successive output pulses. This "slewing" of the output pulse with respect to the input trigger pulse enables the wave form of the high frequency vertical input signal to be reproduced by the sample portions transmitted through the sampling gate and stored as an output signal of lower frequency which can more easily be displayed on the cathode ray tube of such oscilloscope.

The fast ramp generator and comparator circuit of the present invention has several advantages over previous circuits of this type including an antisaturation circuit for preventing the gating device which controls the flow of current to the ramp voltage forming network of such circuit, from being driven into saturation, thereby reducing the switching time of the gating device and causing earlier production of the ramp voltage with respect to the receipt of an input trigger pulse and enabling the gating device to be rendered nonconducting by gating pulses of lower amplitude. In addition, the present circuit employs a simpler comparator circuit in the form of a diode for determining when the ramp voltage exceeds a predetermined reference voltage and causing the production of an output pulse when this happens.

The preferred embodiment of the present circuit also operates more efficiently and accurately by employing a single source of substantially constant D.C. current both to produce the ramp voltage and to supply the bias current to an output tunnel diode connected as a bistable switching circuit to the comparator diode so that such tunnel diode is triggered when the comparator diode is rendered conducting to produce the output pulse. This reduces the noise in the bias current of the output tunnel diode and prevents spurious triggering of such tunnel diode. Furthermore, in the ramp generator and comparator circuit of the present invention the output tunnel diode is not "armed" or conditioned to be triggered until after the start of production of the ramp voltage to prevent any transient signal associated with the start of the ramp voltage from triggering the tunnel diode prematurely. Another advantage is that the output tunnel diode is connected as a bistable switching circuit which is always triggered at substantially the same voltage regardless of the slope of the ramp voltage.

It is therefore one object of the present invention to provide an improved pulse generator circuit for producing an output pulse a predetermined time delay after the receipt of input trigger pulse.

Another object of the present invention is to provide an improved fast ramp generator and comparator circuit having a non-saturating gating device to enable earlier production of the ramp voltage with respect to the receipt of a gating pulse by such device and to cause such circuit to be more sensitive to gating pulses of lower amplitude.

A further object of the invention is to provide an improved ramp generator and comparator circuit of simple and inexpensive construction which employs a single source of substantially constant D.C. current to supply charging current for a ramp voltage forming network and bias current for an output tunnel diode in such circuit to reduce the noise in such bias current and prevent spurious triggering of such tunnel diode.

An additional object of the present invention is to provide an improved fast ramp generator and comparator circuit in which an output tunnel diode employed to produce the output pulse of such circuit is not conditioned to be triggered until after the start of the ramp voltage to prevent such tunnel diode from being triggered by transient signals generated at the start of such ramp voltage.

Still another object of the present invention is to provide a fast ramp generator and comparator circuit for use as the timing unit of a sampling type of cathode ray oscilloscope, which is not sensitive to the slope of the ramp voltage so that for a given reference voltage on the comparator such circuit produces an output pulse at the same voltage level of ramp signals of different rise time.

Other objects and advantages of the present invention will be apparent in the following detailed description of a preferred embodiment thereof and from the attached drawings of which:

The figure shows one embodiment of the fast ramp generator and comparator circuit of the present invention.

The ramp generator and comparator circuit of the present invention includes a regulated source of substantially constant current provided by a transistor 10 of the NPN type, having its emitter connected to a negative D.C. supply voltage of −100 volts through a resistor 12 of 10 kilohms and a variable resistor 14 of 2 kilohms. The base of transistor 10 is connected to a negative D.C. supply voltage of −19 volts through a coupling resistor 16 of 10 ohms so that a current of about 7.5 milliamperes flows between the emitter and collector of such transistor. A high frequency bypass capacitor 15 and an oscillation suppressor resistor 17 are connected in series between the emitter and collector of transistor 10 to guard such transistor against spurious oscillations. The collector of transistor 10 is connected to the collector of a gating transistor 18 of a PNP type through a coupling resistor 20 of 100 ohms and to a ramp voltage forming network 22 through a variable resistor 24 of 200 ohms in series with such coupling resistor. The emitter of the gating transistor 18 is grounded and such transistor is quiescently biased conducting so that substantially all of the current produced by the constant current source including transistor 10 flows to ground through such a gating transistor and not through the pulse forming network 22.

The base of the gating transistor is connected to the cathode of an input tunnel diode 26, having its anode grounded. Tunnel diode 26 is connected as a bistable switching circuit normally biased in its high voltage state by current flowing through a transistor 28 having its collector connected to the cathode of the tunnel diode through a coupling resistor 32 of 470 ohms and its emitter connected to a negative D.C. supply voltage of −19 volts through a resistor 30 of 5.6 kilohms. When tunnel diode 26 is triggered to a low voltage state, a positive step voltage is produced on its cathode and applied to the base of the gating transistor 18 to render such transistor nonconducting. This causes the current previously flowing through the gating transistor 18 to begin flowing through the ramp voltage forming network 22, which may be in the form of a plurality of pairs of series connected timing resistors 34 and timing capacitors 36 of different value which are selectively connected by means of a switch 38 to the current source.

The emitter of transistor 28 is connected through a coupling diode 40 to the collector of gating transistor 18 and the base of transistor 28 is connected to a voltage divider formed by a pair of series resistors 42 and 44 of 16 kilohms and 2 kilohms, respectively, which are connected between a negative D.C. supply voltage of −19 volts and ground. Since the voltage drop across resistor 44 is about −2 volts, the emitter of transistor 28 is held at about −2.5 volts due to the conduction of the transistor. This means that the coupling diode 40 is nonconducting as long as the voltage on the collector of the gating transistor 18 is less than about −2 volts. The coupling diode is rendered conducting when the collector voltage of the transistor exceeds −2 volts and prevents such collector voltage from going more positive. Transistor 28 also provides negative voltage feedback for the gating transistor 18 when coupling diode 40 is conducting to reduce the current flow in such gating transistor. As a result of the voltage clamping action of the antisaturation circuit including the transistor 28 and the coupling diode 40, the gating transistor 18 is prevented from becoming saturated when such transistor is conducting. This reduces the switching time of the gating transistor, which would otherwise be increased substantially due to minority carrier storage if such transistor were allowed to saturate.

The input tunnel diode 26 is triggered when an input signal, which may be the vertical deflection signal of a cathode ray oscilloscope, is applied to an input terminal 46 of a trigger generator circuit 48. The output signal of the trigger generator is transmitted through a coupling capacitor 50 of 100 micromicrofarads and coupling resistor 52 of 51 ohms and differentiated to apply a positive voltage spike to the anode of a trigger shaper tunnel diode 54 to trigger such tunnel diode. The trigger shaper tunnel diode has its cathode grounded and is connected as a bistable switching circuit quiescently biased in a low voltage state by current flowing through a load inductance 56 of 0.5 microhenry connected to the anode of such tunnel diode. The anode of the trigger shaper tunnel diode is also connected through a coupling capacitor 58 of 100 micromicrofarads to the cathode of input tunnel diode 26, so that when such trigger shaper tunnel diode is triggered to a high voltage state the positive step voltage produced on its anode triggers the input tunnel diode to its low voltage state.

When tunnel diode 26 is triggered, the gating transistor 18 is rendered nonconducting and a negative ramp voltage pulse 60 is produced in the pulse forming network 22. The leading edge of the ramp voltage 60 decreases linearly in time after an initial fast rising step produced by the coupling diode 40 being rendered nonconducting, since the current flowing through network 22 is supplied by the constant current source including transistor 10. A comparator diode 62 having its anode connected to the output of a staircase voltage generator 64, is connected to the ramp forming network 22 by its cathode through a coupling resistor 66 of 75 ohms and to the anode of an output tunnel diode 68. The output tunnel diode is connected as a bistable switching circuit quiescently biased in a low voltage state by bias current from the constant current source including transistor 10 connected to the cathode of such tunnel diode. The comparator diode 62 is normally biased nonconducting by a negative step voltage applied to the anode of such diode by the staircase generator. When the negative ramp voltage 60 applied to the cathode of the comparator diode decreases to a value less than the stairstep voltage, the comparator diode is suddenly rendered conducting. This increases the current flowing through the output tunnel diode 68 to trigger such tunnel diode to a high voltage state.

The output tunnel diode is quiescently biased in a low voltage state with zero bias current since the gating transistor is normally conducting. When the gating transistor 18 and coupling diode 40 are rendered nonconducting to start the ramp voltage, the current in the output tunnel diode 68 is increased to a value slightly less than the peak current of such tunnel diode to "arm" the tunnel diode so that it can be triggered as soon as the comparator diode 62 is rendered conducting. This "arming" of the output tunnel diode 68 prevents spurious triggering of the tunnel diode by any transient signals produced at the start of the ramp voltage. In addition, the use of a constant current source to supply the bias current for the output tunnel diode enables the arming current level of the tunnel diode to be much closer to its peak current without triggering such tunnel diode, due to the reduction in noise in such bias current.

The anode of the output tunnel diode 68 is connected to one terminal of a primary winding 70 of a transformer 72 and the other end of such primary winding is connected through an RC network including a resistor 73 of 390 ohms in parallel with a capacitor 74 of 47 micromicrofarads to the cathode of such output tunnel diode. The RC time constant of the network including resistor 73 and 74 is made equal to the $L/R$ time constant of the inductance and resistance of the primary winding 70 so that the load impedance of the output tunnel diode does not vary with frequency. This renders the output tunnel diode insensitive to changes in slope of the ramp voltage 60 and enables it to always be triggered at substantially the same voltage level on the ramp voltage immediately after the comparator diode 62 is rendered conducting for a given stairstep reference voltage.

The secondary winding 76 of the output transformer 72 is connected across a load which may be an avalanche transistor or other utilization circuit, and is represented here by a pair of series connected resistors 78 and 80. The common terminal of the load resistor 80 and the upper end of secondary winding 76 is grounded while the common terminal of a load resistor 78 and the lower end of such secondary winding is connected to a signal output terminal 82. Thus the positive output pulse of the output tunnel diode is inverted and transmitted to output terminal 82 as a negative voltage pulse due to the polarity of the transformer windings indicated as the same by dots. The common terminal of load resistors 78 and 80 is connected to the input of the staircase voltage generator 64 so that the portion of the output pulse produced across resistor 80 is transmitted to such staircase generator in order to decrease its output voltage one stairstep for each output pulse so received. As a result the output signal of the stairstep voltage generator provides the comparator diode 62 with a slightly greater reverse bias voltage after each successive output pulse. This means that the output tunnel diode 68 is triggered at successively more negative points on the leading edge of the ramp voltage 60 for each output pulse so that the output pulses are delayed with respect to their corresponding input signals applied to input terminal 46 by successively greater times.

A monostable holdoff multivibrator 84 is provided with its output connected to the tunnel diodes 54 and 26 for reverting such tunnel diodes to their quiescent state. The holdoff multivibrator is triggered by an output pulse from the trigger generator 48 when an input signal is applied to such trigger generator at the same time the tunnel diodes 54 and 26 are triggered by another pulse from such trigger generator. When it is triggered the holdoff multivibrator 84 produces a positive voltage pulse which holds the tunnel diodes 26 and 54 in their triggered stable states and prevents such tunnel diodes from being retriggered until after the output tunnel diode 68 has been triggered by the ramp voltage to produce the output pulse. When the positive output pulse of the holdoff multivibrator 84 terminates its negative going trailing edge reverts the tunnel diodes 26 and 54 to their quiescent state so that they are able to be retriggered by the next output trigger pulse produced by the trigger generator 48.

When tunnel diode 26 is reverted it applies a negative going step voltage to the base of the gating transistor 18 which renders such transistor conducting. As a result the charged capacitor 36 in the ramp voltage forming network 22 rapidly discharges through the gating transistor to its quiescent voltage at a faster rate than it charged and produces the positive going trailing edge of the ramp voltage 60. The trailing edge of the ramp voltage 60 renders the comparator diode 62 again nonconducting and reverts the output tunnel diode 68 to its quiescent low voltage stable state. This completes one cycle of operation of the fast ramp generator and comparator circuit of the present invention.

It should be noted that the width of the holdoff signal produced by holdoff multivibrator 84 is varied by means of a selector switch 86 connected in different positions to one of a plurality of holdoff capacitors 88 of different values related to the values of the different timing capacitors 36 in the ramp forming network. The movable contact of selector switch 86 is ganged to the movable contact of switch 38 in the ramp forming network in order to increase the width of the holdoff signal when the slope of the leading edge of the ramp voltage 60 is decreased. The width of the holdoff signal is slightly greater than the maximum time between the start of the ramp voltage and the triggering of the output tunnel diode 68 which occurs when the largest negative stairstep of the staircase voltage is applied to the comparator diode.

It will be obvious to those having ordinary skill in the art that various changes may be made in the details of the above described preferred embodiment of the present invention without departing from the spirit of the invention. Therefore the scope of the present invention should only be determined by the following claims.

I claim:

1. A pulse generator circuit for producing a delayed output pulse a predetermined time after the application of an input trigger pulse, comprising:

a gating device quiescently biased conducting and having a plurality of electrodes including a control electrode for switching said gating device between conduction and nonconduction;

a regulated source of current connected to said gating device to transmit said current through said gating device when it is conducting;

a ramp forming network connected to said current source for producing a ramp voltage when said gating device is rendered nonconducting;

a first switching circuit having at least one stable state, connected to the control electrode of said gating device so that the output signal of said first oscillator renders said gating device nonconducting when said first switching circuit is triggered;

a comparator device quiescently biased nonconducting and having at least two electrodes with one electrode connected to said network and another electrode connected to a reference voltage so that said comparator device is rendered conducting when said ramp voltage exceeds said reference voltage;

a second switching circuit having at least one stable state connected to said network and connected between the constant current source and said comparator device so that the bias current of said second switching circuit is provided by said constant current source, said second switching circuit being conditioned to be triggered by the rendering of the gating device nonconducting and being triggered to produce an output pulse when said comparator device is rendered conducting; and means for preventing the gating device from saturating when it is in a conducting state.

2. A pulse generator circuit for producing a delayed output pulse a predetermined time after the application of an input trigger pulse, comprising:

a gating device quiescently biased conducting and having a plurality of electrodes including a control electrode for switching said gating device between conduction and nonconduction;

a source of substantially constant current connected to said gating device to transmit said current through said gating device when it is conducting;

a ramp forming network connected to said current source for producing a ramp voltage when said gating device is rendered nonconducting;

a first switching circuit having at least one stable state, connected to the control electrode of said gating device so that the output signal of said first switching circuit renders said gating device nonconducting when said first switching circuit is triggered;

a comparator device quiescently biased nonconducting and having at least two electrodes with one electrode connected to said network and another electrode connected to a reference voltage so that said comparator device is rendered conducting when said ramp voltage exceeds said reference voltage;

a second switching circuit having at least one stable state connected to said network and connected between the constant current source and said comparator device so that the bias current of said second switching circuit is provided by said constant current source, said second switching circuit being conditioned to be triggered by the rendering of the gating device nonconducting and being triggered to produce an output pulse when said comparator device is rendered conducting;

means for preventing the voltage of the electrode of the gating device connected to the constant current source from exceeding a predetermined value to prevent the gating device from saturating when it is conducting; and means for changing the reference voltage of the comparator device one step voltage for each output pulse in order to vary the time delay of the output pulses.

3. A pulse generator circuit for producing a delayed output pulse a predetermined time after the application of an input trigger pulse, comprising:

a gating transistor quiescently biased conducting and having a control electrode for switching said gating transistor between conduction and nonconduction;

a regulated source of current connected to said gating transistor to transmit said current through said gating transistor when it is conducting;

a ramp forming network connected to said current source for producing a ramp voltage when said gating transistor is rendered nonconducting;

a first tunnel diode switching circuit having at least one stable state, connected to the control electrode of said gating transistor so that the output signal of said first tunnel diode renders said transistor nonconducting when said first tunnel diode is triggered;

a comparator device quiescently biased nonconducting and having at least two electrodes with one electrode connected to said network and its other electrode connected to a reference voltage so that said comparator device is rendered conducting when said ramp voltage exceeds said reference voltage;

a second tunnel diode switching circuit having at least one stable state, connected to said network and connected between the constant current source and said comparator device so that the bias current of said second tunnel diode is supplied by the constant current source, said second tunnel diode being conditioned to be triggered only after the start of the ramp voltage and being triggered to produce an output pulse after said comparator device is rendered conducting; and voltage clamp means for preventing the gating transistor from saturating.

4. A pulse generator circuit for producing a delayed output pulse a predetermined time after the application of an input trigger pulse, comprising:

a gating transistor quiescently biased conducting and having a control electrode for switching said gating transistor between conduction and nonconduction;

a source of substantially constant current connected to said gating transistor to transmit said current through said gating transistor when it is conducting;

a ramp forming network connected to said current source for producing a ramp voltage when said gating transistor is rendered nonconducting;

a first bistable tunnel diode switching circuit connected to the control electrode of said gating transistor so that the output signal of said first tunnel diode renders said transistor nonconducting when said first tunnel diode is triggered;

a comparator diode quiescently biased nonconducting and having one electrode connected to said network and its other electrode connected to a reference voltage so that said comparator diode is rendered conducting when said ramp voltage exceeds said reference voltage;

a second bistable tunnel diode switching circuit connected to said network and connected between the constant current source and said comparator diode so that the bias current of said second tunnel diode is supplied by the constant current source, said second tunnel diode being conditioned to be triggered after the gating device is rendered nonconducting and being triggered to produce an output pulse after said comparator diode is rendered conducting;

means for preventing the gating transistor from saturating; and means for reverting said first tunnel diode to its quiescent state to render the gating transistor conducting which terminates the ramp voltage and causes the trailing edge of the ramp voltage to render the comparator diode nonconducting and to revert the second tunnel diode to its quiescent state.

5. A pulse generator circuit for producing a delayed output pulse a predetermined time after the application of an input trigger pulse, comprising:

a gating transistor quiescently biased conducting and having a control electrode for switching said gating transistor between conduction and nonconduction;

a source of substantially constant current connected to said gating transistor to transmit said current through said gating transistor when it is conducting;

a ramp forming network connected to said current source for producing a ramp voltage when said gating transistor is rendered nonconducting;

a first bistable tunnel diode switching circuit connected to the control electrode of said gating transistor so that the output signal of said first tunnel diode renders said transistor nonconducting when said first tunnel diode is triggered;

a comparator diode quiescently biased nonconducting and having one electrode connected to said network and its other electrode connected to a reference voltage so that said comparator diode is rendered conducting when said ramp voltage exceeds said reference voltage to cause the termination of said ramp voltage;

a second bistable tunnel diode switching circuit connected to said network and said comparator diode to trigger said second tunnel diode and produce an output pulse when said comparator diode is rendered conducting;

a clamping diode having one electrode connected to the common connection of said gating transistor and said source of current;

a feedback transistor connected between the other electrode of the clamping diode and the control electrode of said gating transistor;

means for applying a substantially constant clamp voltage to said other electrode of said clamping diode to normally bias the clamping diode nonconducting and for preventing the voltage on the electrode of the gating transistor connected to said clamping diode from exceeding said clamp voltage to prevent the gating transistor from saturating; and means for reverting the first tunnel diode and rendering the gating transistor conducting to terminate the ramp voltage and cause the comparator diode to be again rendered nonconducting and to revert the second tunnel diode.

6. A pulse generator circuit for producing a delayed output pulse a predetermined time after the application of an input trigger pulse, comprising:

a gating transistor quiescently biased conducting and having a control electrode for switching said gating transistor between conduction and nonconduction;

a source of substantially constant current connected to said gating transistor to transmit said current through said gating transistor when it is conducting;

a ramp forming network including a plurality of capacitors selectively connected to said current source for producing a ramp voltage when said gating transistor is rendered nonconducting, said ramp voltage having a leading edge whose slope changes with the value of the selected capacitor;

a first bistable tunnel diode switching circuit connected to the control electrode of said gating transistor so that the output signal of said first tunnel diode renders said transistor nonconducting when said first tunnel diode is triggered;

trigger generator means for triggering said first tunnel diode when an input signal is received by said trigger generator means;

a comparator diode quiescently nonconducting and having one electrode connected to said network and its other electrode connected to a reference voltage so that said comparator diode is rendered conducting when said ramp voltage exceeds said reference voltage to cause the termination of said ramp voltage;

a second bistable tunnel diode switching circuit connected to said network and connected between the constant current source and said comparator diode so that the bias current of said second tunnel diode is supplied by the constant current source, said second tunnel diode being conditioned to be triggered after the start of the ramp voltage and being triggered to produce an output pulse after said comparator diode is rendered conducting;

a transformer having a primary winding and a secondary winding with its primary winding connected to said second tunnel diode;

a compensation impedance including a capacitor in parallel with a resistor, connected in series between said primary winding and said second tunnel diode and having an RC time constant equal to the $L/R$ time constant of the inductance and resistance of said primary winding;

a clamping diode having one electrode connected to the common connection of said gating transistor and said constant current source;

a feedback transistor connected between the other electrode of the clamping diode and the control electrode of said gating transistor;

a staircase voltage generator having its output connected to said comparator diode and its input connected to the secondary winding of said transformer to increase the voltage of its staircase output signal one step for each output pulse produced by said second tunnel diode; and means for reverting the first tunnel diode to render the gating transistor nonconducting and terminate the ramp voltage after the second tunnel diode has been triggered and to cause the comparator diode to be rendered nonconducting and to revert the second tunnel diode.

7. A pulse generator circuit for producing a delayed output pulse a predetermined time after the application of an input trigger pulse, comprising:

a gating device;

a ramp voltage forming network;

a regulated source of current connected to said gating device and to said network so that said current is transmitted through said network to form a ramp voltage only after said gating device is switched between conduction and nonconduction;

a first switching circuit having at least one stable state and connected to said gating device to enable the output signal of said first switching circuit to switch said gating device and start the production of said ramp voltage when said first switching circuit is triggered in response to said input trigger pulse;

comparator means connected to said network for comparing said ramp voltage with a reference voltage so that said comparator is switched between conduction and nonconduction when said ramp voltage exceeds said reference voltage;

a second switching circuit having at least one stable state and connected to comparator means so that said second switching circuit is triggered to produce an output pulse when said comparator means is switched; and antisaturation means for preventing the gating device from saturating when it is in a conducting state.

8. A pulse generator circuit in accordance with claim 7 in which the antisaturation means includes a voltage clamping means connected to the common terminal of the gating device and the current source, and amplifying means connected between said voltage clamping means and the control electrode of said gating device.

9. A pulse generation circuit in accordance with claim 8 in which the first and second switching circuits are bistable.

10. A pulse generator circuit in accordance with claim 8 in which the gating device is a transistor, the voltage clamping means is a diode and the amplifying means is a transistor connected to form a series circuit with said diode between the collector and base electrodes of the gating transistor.

11. A pulse generator circuit in accordance with claim 9 in which the first and second switching circuits are formed by tunnel diodes.

12. A pulse generator circuit in accordance with claim 7 in which the comparator means is connected to a staircase voltage generator which supplies the reference voltage as a varying staircase voltage which increases in voltage one step for each output pulse produced.

References Cited

UNITED STATES PATENTS

| | | | |
|---|---|---|---|
| 3,138,764 | 6/1964 | Dalton et al. | 307—88.5 |
| 3,191,069 | 6/1965 | Sampson | 307—88.5 |

J. S. HEYMAN, *Assistant Examiner.*

ARTHUR GAUSS, *Primary Examiner.*

UNITED STATES PATENT OFFICE

CERTIFICATE OF CORRECTION

Patent No. 3,344,285 September 26, 1967

George J. Frye

It is hereby certified that error appears in the above numbered patent requiring correction and that the said Letters Patent should read as corrected below.

Column 5, line 59, for "oscillator" read -- switching circuit --; column 8, line 43, after "quiescently" insert -- biased --.

Signed and sealed this 1st day of October 1968.

(SEAL)
Attest:

Edward M. Fletcher, Jr.
Attesting Officer

EDWARD J. BRENNER
Commissioner of Patents